United States Patent [19]
Burd et al.

[11] 4,180,119
[45] Dec. 25, 1979

[54] MOLD FOR DIRECTIONALLY SOLIDIFIED SINGLE CRYSTAL CASTINGS AND METHOD FOR PREPARING SAME

[75] Inventors: Lamar Burd, Andover; James K. Donnelly, Dover, both of N.J.

[73] Assignee: Howmet Turbine Components Corporation, Muskegon, Mich.

[21] Appl. No.: 943,212

[22] Filed: Sep. 18, 1978

[51] Int. Cl.² .................... B22C 9/04; B22D 25/06
[52] U.S. Cl. .......................................... 164/34; 164/60; 164/361; 164/338 M
[58] Field of Search ............ 164/34, 60, 361, 125–127, 164/338 R, 338 M; 156/616 R

[56] References Cited
U.S. PATENT DOCUMENTS

| | | | |
|---|---|---|---|
| 3,373,795 | 3/1968 | Hein | 164/361 X |
| 3,401,738 | 9/1968 | Parille | 164/361 X |
| 3,627,015 | 12/1971 | Giamei et al. | 164/60 |
| 3,690,368 | 9/1972 | Copley et al. | 164/34 X |
| 3,729,050 | 4/1973 | Carnot et al. | 164/361 |
| 4,133,368 | 1/1979 | Hayes | 164/60 X |

*Primary Examiner*—Robert D. Baldwin
*Assistant Examiner*—J. Reed Batten, Jr.
*Attorney, Agent, or Firm*—McDougall, Hersh & Scott

[57] ABSTRACT

A shell mold for producing directionally solidified single crystal metal castings in which use is made of a crystal selector of helical shape wound about a support of a non heat disposable material which eliminates the need for providing a crystal selector of sufficient dimension for self support or other supporting means which may form a part of the pattern assembly about which the shell mold is formed.

8 Claims, 2 Drawing Figures

MOLD FOR DIRECTIONALLY SOLIDIFIED SINGLE CRYSTAL CASTINGS AND METHOD FOR PREPARING SAME

This invention relates to directionally solidified single crystal metal castings and to elements employed in the manufacture of same.

BACKGROUND OF THE INVENTION

Directionally solidified castings either columnar grained, as in the Ver Snyder U.S. Pat. No. 3,260,505 or single crystal as in the Piearcey U.S. Pat. No. 3,494,709 are cast in molds in which the temperature gradient during solidification is established by selectively controlling the power input to a plurality of heating coils spaced along the vertical axes of the mold. A similar temperature gradient can also be established by other means including the gradual withdrawal of the heated mold from a chamber which is heated above the melting point of the alloy. The mold is heated to a temperature above the melting temperature of the metal to be poured in order to avoid nucleation other than at the bottom of the mold.

Production of such directionally solidified single crystal castings requires a starter zone in the mold and a crystal selector which restricts the growth to a single crystal into the article portion of the mold. The crystal selector is generally a non-linear passageway from the starter zone to the article portion of the mold. This is usually a helically shaped passage terminating at the base of the article portion of the mold and having an open lower end communicating with the starter portion. The crystal selector comprises a small passage and thereby is limited in the cross sectional area. As a result, the crystal selector is incapable, by itself, of sufficient strength to support the pattern around which the mold is formed to provide a cavity to form the cast article.

In the past, use has been made of cocoons to provide a heat transfer path from the solidifying casting to the chill or heat sink beneath the mold. Although the cocoon provides additional mechanical support to the pattern, its use requires a two stage mold construction which complicates and increases the cost of the mold. However, cocoons are not necessary for heat transfer when the mold is withdrawn from the heated chamber. When the cocoon is not used, the benefits of its added mechanical support are lost and the helix must be large enough to support the pattern portion of the mold or pattern support must be provided by additional mold fixtures. Such construction of increased dimension imposes limitations on metal efficiency and equipment utilization.

DESCRIPTION OF THE INVENTION

Figure 1:
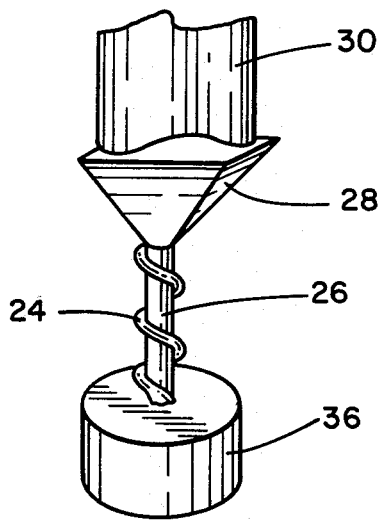
FIG. 1 is a perspective elevational view of the pattern support portion of the wax assembly prior to forming the shell thereabout for use in shell casting.
Figure 2:
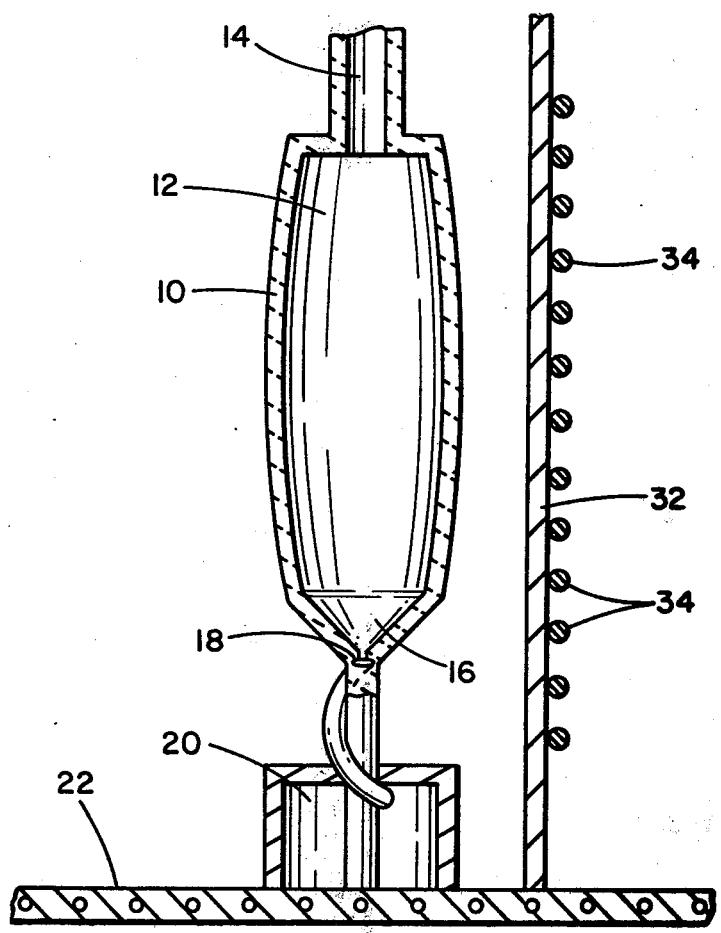
FIG. 2 is an elevational sectional view of a portion of the mold assembly prior to metal casting showing one of the several mold cavities in a mold assembly.

It is an object of this invention to provide a mold assembly for unidirectional solidification of molten metal cast into the mold and wherein use is made of a crystal selector which achieves a single crystal casting, but does not impose a limitation on metal efficiency and mold strength and in which metal utilization, mold strength and manufacturing efficiency are optimized.

The usual elements for unidirectional solidification in a single crystal are embodied in a shell mold 10 having an article mold cavity 12 open at the upper end for receiving a pouring spout 14 through which molten metal is poured in forming the casting. The cavity 12 extends from a ramp 16 which converges to a helix 18. The helix forms a passageway which is utilized as a crystal selector, preferably for selection of a single crystal from a columnar growth occurring in the starter chamber 20 which is in contact with a chill plate 22.

Although the crystal selector is shown as a helical tubular section, it need only be a tubular passage with enough changes in direction to exclude all but the grain desired to continue through the ramp portion 16 to the bottom of the article forming portion 12 of the mold. Thus a bent tubular passage with enough changes in direction in the horizontal plane for producing a change in direction of a least 180° would be sufficient. The tubular passage preferably has its center line continuously on an uphill slope and is large enough in diameter to permit relatively free flow of molten metal therethrough. The bottom end of the tubular passage should be spaced from the chill plate 22, as by means of the starter chamber 20, to permit a columnar crystal to grow into the entrance portion at the bottom of the tubular passage.

In accordance with the practice, to form the crystal or grain selector in each cavity of the mold assembly, a tubular member 24 of helical shape is formed about a central column 26 dimensioned to extend continuously from the ramp forming member 28 through the helix to the starter chamber 36. The central column 26 is preferably formulated of a ceramic material, in the form of a post high strength so as to be able to assume the load otherwise imposed on the crystal selector. In manufacture, the helix 24 or other pattern for the crystal selector is formed of a heat disposable material, such as wax or plastic, and wound about a central post either by hand or by injection.

The starter chamber 36 extends downwardly from the bottom of the helix and the transition or ramp forming section 28 extends from the upper end of the helix with a suitable ramp angle. To complete the pattern, the pattern portion 30 is simply placed on the grain selector and ramp forming portion 28 and the conventional gating is provided for communicating the upper end of the pattern with the pouring crucible, after which the entire assembly is processed through the conventional shell forming steps to form a ceramic shell about the assembly.

The shell mold is ready for metal casting after firing to remove the heat disposable material following conventional procedures for shell casting.

The central column 26 remains for support of the mold with the helix or other crystal selector comprising a hollow helical passage about a periphery of the column.

In use, the prepared mold is placed on a chill plate 22 and surrounded by a susceptor 32 with heating coils 34 to heat the mold to above the melting point of the metal to be poured and to control the temperature gradient of the mold during metal solidification to form the article as a single crystal. Gradual withdrawal of the poured mold from the susceptor 32 may also be used to control the temperature gradient. Molten metal flows from the crucible through the runners into the upper portion of the mold cavities 12 to fill the mold cavities and the underlying transition sections 16, crystal selectors 18 and the starter chambers 20. With the removal of heat from the bottom of the mold by the chill plate, crystallization of the metal or alloy begins at each of the starter portions and through the helixes which serves to select a single crystal for each article as the solidification proceeds into the transition portions 16. Crystallization of the cast metal continues through the article portions of the mold. The desired thermal gradient which assures crystallization in the form of a single crystal is controlled by the susceptor 32 and the heat coils 34. Gradual withdrawal of the poured mold from the heated susceptor 32 may also be used to assure the desired thermal gradient.

Upon complete solidification, the mold can be broken up to free the castings.

Since the central column 26 provides the needed strength for support of the wax pattern, the crystal selector is released from limitations imposed thereon so that use can be made of a crystal selector of minimum dimension. Also, the need for additional supports are eliminated thereby to simplify mold construction and use.

It will be apparent that considerable economy is obtained in the preparation of a shell mold embodying the features of this invention because the crystal selector and column support can be incorporated to form an integral part of the mold assembly produced in the same shell forming process. The result is a mold of high strength and lower cost with the crystal selector and support built into the mold assembly.

It will be understood that the columnar support about which the crystal selector is formed can be other than circular in cross section. For example, it may be of oblong or other curvilinear shape and it may be formed of material other than ceramic material. It should nevertheless be fabricated of a material which retains its strength and shape at temperatures above the temperature to which it will be heated during the metal casting and solidification steps. Materials such as graphite, glass, refractory metal and the like might be used for the supporting column but it is preferred to make use of a ceramic material which is relatively inert to the cast molten metal.

It will be understood that changes may be made in the details of construction, arrangement and operation without departing from the spirit of the invention, especially as defined in the following claims.

We claim:

1. Apparatus for casting single crystal articles including a shell mold, a chill plate on which the shell mold is adapted to rest, said shell mold including one or more starter chambers at the lower end adapted to contact the chill plate, one or more mold cavities, each having an inlet at its upper end portion for the introduction of molten metal into the shell mold, and a helical passage communicating at its upper end with the mold cavity and extending downwardly to the starter chamber for selecting a single crystal to grow into the metal in the mold cavity during solidification, the improvement which comprises a rigid columnar support extending continuously alongside the helical passage down through the starter chamber.

2. Apparatus as claimed in claim 1 which includes a ramp portion between the upper end of the helical passage and the lower end of the mold cavity through which the selected crystal grows into the metal forming the article in the mold cavity to form a single crystal.

3. Apparatus as claimed in claim 1 which includes means for controlling the temperature gradient in the mold during metal solidification comprising a susceptor which holds the mold, heating coils about the susceptor for controlling the temperature thereof and a mechanism for the gradual withdrawal of the poured mold from the heated susceptor.

4. In the preparation of a shell mold for the production of single crystal castings in which the shell mold includes one or more mold cavities, a starter chamber underlying the mold cavity and a tubular section which extends in a non-linear path between the starter chamber and the mold cavity for limiting transmission to a single crystal, the improvement comprising forming the tubular section by positioning a tubular length of disposable material in a non-linear path about a central column of a high strength material that is not disposable by heat, forming a ceramic shell about the tubular length and removing the disposable material, whereby a tubular section remains as a non-linear path about the supporting central column.

5. The preparation of a shell mold as claimed in claim 4 in which the disposable material is formed as a helix about the central column to provide a tubular section of helical shape.

6. The preparation of a shell mold as claimed in claim 4 in which the disposable material is a heat disposable material.

7. The preparation of a shell mold as claimed in claim 6, in which the heat disposable material is wax or plastic.

8. The preparation of a shell mold as claimed in claim 4 in which the central column extends from the top of the tubular section of the crystal selector to the starter chamber.

* * * * *